(12) United States Patent
Langit

(10) Patent No.: US 9,602,125 B1
(45) Date of Patent: Mar. 21, 2017

(54) WIDEBAND INP DIGITAL-TO-ANALOG CONVERTER INTEGRATED WITH A SIGE CLOCK DISTRIBUTION NETWORK

(71) Applicant: NORTHROP GRUMMAN SYSTEMS CORPORATION, Falls Church, VA (US)

(72) Inventor: Christopher Langit, Torrance, CA (US)

(73) Assignee: Northrup Grumman Systems Corporation, Falls Church, VA (US)

( * ) Notice: Subject to any disclaimer, the term of this patent is extended or adjusted under 35 U.S.C. 154(b) by 428 days.

(21) Appl. No.: 14/504,172

(22) Filed: Oct. 1, 2014

(51) Int. Cl.
*H03M 1/66* (2006.01)

(52) U.S. Cl.
CPC .................... *H03M 1/66* (2013.01)

(58) Field of Classification Search
CPC ...................................... H03M 1/66
USPC ................................. 341/155, 156
See application file for complete search history.

(56) References Cited

U.S. PATENT DOCUMENTS

| | | | |
|---|---|---|---|
| 6,429,715 B1 * | 8/2002 | Bapat | G06F 1/10 327/158 |
| 6,433,598 B1 | 8/2002 | Schultz | |
| 6,525,577 B2 | 2/2003 | Lee | |
| 6,657,130 B2 * | 12/2003 | Van Dyke | H01L 23/49822 174/255 |
| 6,698,006 B1 * | 2/2004 | Srinivasan | G06F 1/10 716/114 |
| 7,023,252 B2 | 4/2006 | Schultz | |
| 7,301,385 B2 | 11/2007 | Takano et al. | |
| 7,511,548 B2 | 3/2009 | Bueti et al. | |
| 7,679,416 B2 | 3/2010 | Cheng et al. | |
| 7,859,309 B2 | 12/2010 | Lo | |
| 7,890,904 B2 | 2/2011 | Murgai et al. | |
| 7,917,875 B1 | 3/2011 | Johnston | |
| 8,179,181 B2 | 5/2012 | Lung et al. | |
| 8,294,524 B2 | 10/2012 | Pellon | |
| 8,432,210 B2 | 4/2013 | Brown et al. | |
| 8,629,548 B1 | 1/2014 | Andreev et al. | |

(Continued)

OTHER PUBLICATIONS

Green, Daniel S. et al. "The DARPA Diverse Accessible Heterogeneous Integration (DAHI) Program: Status and Future Directions" CS MANTECH Conference, May 19-22, 2014, USA pp. 343-346.

(Continued)

*Primary Examiner* — Jean B Jeanglaude
(74) *Attorney, Agent, or Firm* — John A. Miller; Miller IP Group, PLC

(57) ABSTRACT

A digital-to-analog converter (DAC) including a DAC core circuit having a plurality of input lines each being responsive to a digital bit input signal and an output line outputting a converted analog signal of the digital bits. The DAC also includes a clock circuit responsive to a clock input signal at one frequency and outputting a clock output signal at another frequency. The DAC also includes a clock tree distribution network responsive to the clock output signal from the clock circuit and splitting the clock output signal into a plurality of split clock signals that are applied to the DAC core circuit, where the DAC core circuit is fabricated in an indium phosphide (InP) semiconductor material and the clock tree distribution network is fabricated in a silicon germanium (SiGe) semiconductor material.

20 Claims, 4 Drawing Sheets

(56) References Cited

U.S. PATENT DOCUMENTS

2014/0211581 A1    7/2014   Chu et al.

OTHER PUBLICATIONS

Oyama, B. et al. "InP HBT/Si CMOS-based 13-Bit 1.33Gsps Digital-to-Analog Converter with >70 dB SFDR" IEEE 2012, 4 pgs.
Rajaram, Anand et al. "Robust Chip-Level Clock Tree Synthesis" IEEE Transactions on Computer-Aided Design of Integrated Circuits and Systems vol. 30, No. 6, Jun. 2011, pp. 877-890.
Geng, Xueyang et al, "An 11-Bit 8.6 GHz Direct Digital Synthesizer MMIC With 10-Bit Segmented Sine-Weighted DAC" IEEE Journal of Solid-State Circuits, vol. 45, No. 2, Feb. 2010, pp. 300-313.
Rajaram, Anand et al. "Robust Chip-Level Clock Tree Synthesis for SOC Designs" DAC 2008, Jun. 8-13, pp. 720-723.
Yu, Xuefeng, et al. "A 12 GHz 1.9 W Direct Digital Synthesizer MMIC Implemented in 0.18 μm SiGe BiCMOS Technology" IEEE Journal of Solid-State Circuits, vol. 43, No. 6, Jun. 2008, pp. 1384-1393.
Turner, Steven Eugene, "High-Speed Digital and Mixed-Signal Components for X- and Ku-Band Direct Digital Synthesizers in Indium Phosphide DHBT Technology" A Thesis, Graduate school of University of Maine, USA, May 2006, pp. 1-155.
Tsai, Jeng-Liang et al. "Zero Skew Clock-Tree Optimization with Buffer Insertion/Sizing and Wire Sizing" IEEE Transactions on Computer-Aided Design of Integrated Circuits and Systems, vol. 23, No. 4, Apr. 2004, pp. 565-572.

\* cited by examiner

WIDEBAND INP DIGITAL-TO-ANALOG CONVERTER INTEGRATED WITH A SIGE CLOCK DISTRIBUTION NETWORK

GOVERNMENT CONTRACT

This invention was made with Government support under Contract FA8650-07-C-7713 awarded by the Air Force Research Laboratory. The Government has certain rights in the invention.

BACKGROUND OF THE INVENTION

Field

This invention relates generally to a digital-to-analog converter (DAC) that includes a clock tree distribution network and, more particularly, to a DAC including a DAC core circuit and a clock tree distribution network, where the clock tree distribution network is fabricated in SiGe and the DAC core circuit is fabricated in InP.

Discussion

There are many applications that require a digital-to-analog converter (DAC), such as converting digitally stored audio signals to a representative analog signal that is suitable to drive an audio amplifier and a speaker. A typical DAC will include an array of converter cells that each receive a digital data signal and convert the signal to a representative voltage and/or frequency that is combined with the voltage and/or frequency from the other cells through a current switching network. It is necessary to provide accurate clock signal timing between the current switching networks in the various cells to achieve a high dynamic range. Particularly, clock misalignment or skew across the DAC cell array typical translates into unwanted spurs in the DAC analog output signal. However, maintaining signal integrity throughout the switching network becomes more difficult at higher frequencies. A digital clock tree distribution network is a known clock signal distribution circuit for DACs and is currently the most common solution for minimizing clock skew across a DAC cell array.

Modern DACs of the type discussed above are fabricated as integrated circuits using various semiconductor materials. As is well understood by those skilled in the art, different semiconductor materials offer different properties and advantages for a DAC. Semiconductor material trade-offs are typically made between maximum clock frequency, clock skew, signal integrity and power dissipation. For example, it is known in the art to fabricate DAC core and clock tree distribution circuits from either indium phosphide (InP) or silicon germanium (SiGe). InP provides a higher voltage breakdown, which provides higher output voltages that may be beneficial for defining over noise. However, InP does not allow devices in the circuit to be closely spaced together, which increases clock skew and signal mismatch. SiGe does not provide a high voltage breakdown and voltage output, but does allow for a reduction in clock skew as a result of the devices being more closely space together.

DETAILED DESCRIPTION OF THE EMBODIMENTS

The following discussion of the embodiments of the invention directed to a DAC including a DAC core circuit fabricated in InP and a digital clock tree distribution network fabricated in SiGe is merely exemplary in nature, and is in no way intended to limit the invention or its applications or uses.

As will be discussed in detail below, the present invention proposes a DAC including a DAC core circuit that converts multiple digital input bits to an analog output signal and a digital clock tree distribution network that provides clock timing signals for each of the DAC cells in the DAC circuit. The DAC core circuit is fabricated in InP that provides a high voltage breakdown so as to allow higher voltage outputs and the clock tree distribution network is fabricated in SiGe to allow for a higher density of transistors in a smaller area to provide a reduction in clock skew.

Figure 1:
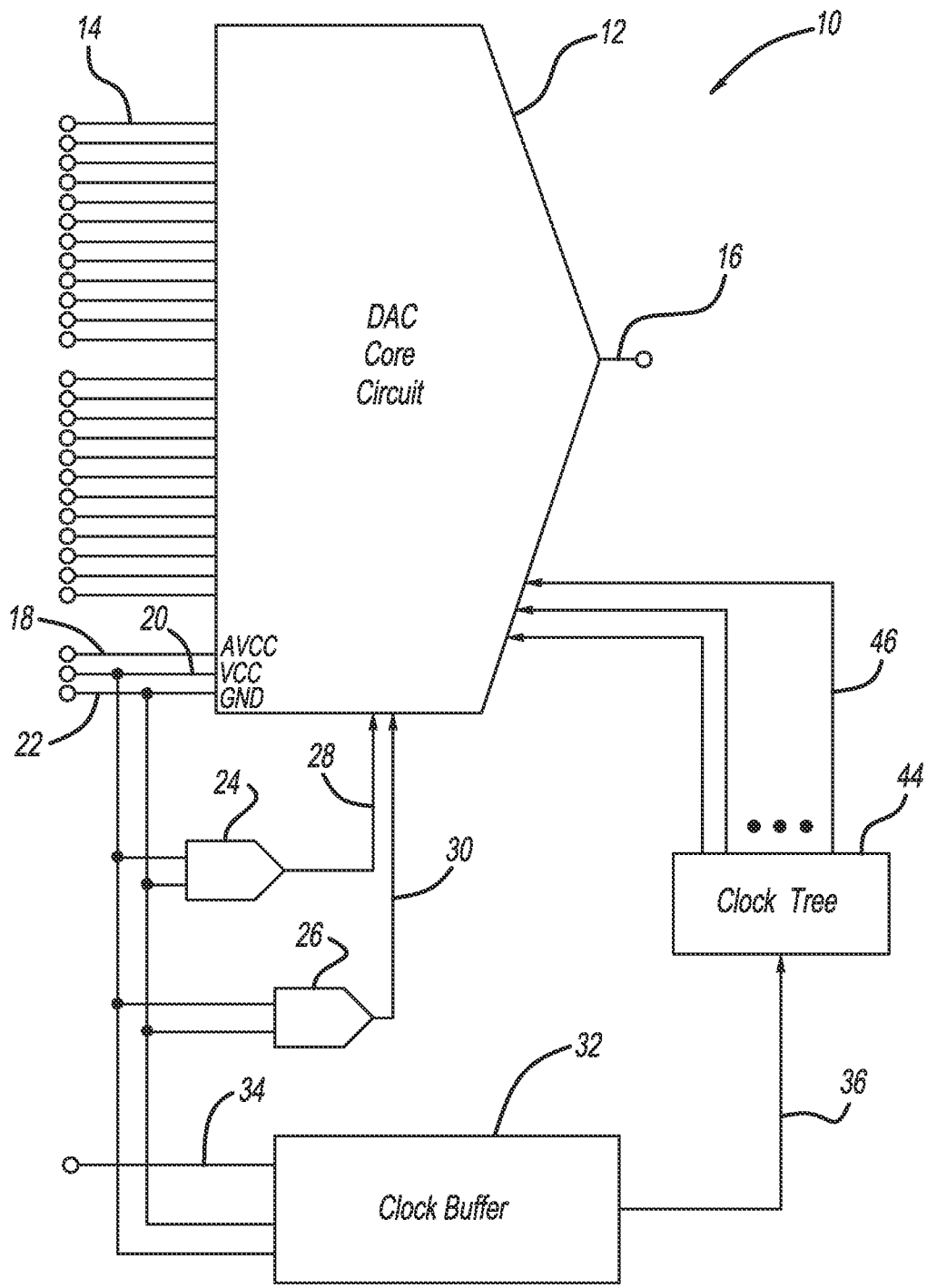
FIG. 1 is a high level schematic diagram of a DAC including a DAC core circuit and a clock tree distribution network.

FIG. 1 is a high level schematic diagram of a DAC 10 including a DAC core circuit 12 that converts multiple digital bit input signals on lines 14, where each of the digital input signals includes an A and B component, to an analog output signal on line 16. For this type of DAC circuit, the components of the circuit 12, discussed in more detail below, convert the digital signals in both frequency and amplitude so that the particular converted frequency and amplitude identifies the analog value on the line 16, where the frequency has a relatively wide bandwidth. The DAC core circuit 12 receives two different drive voltages, namely, AVCC and VCC on lines 18 and 20, respectively, and is connected to a ground reference line 22. The DAC 10 also includes two voltage bias circuits 24 and 26 that receive the drive voltage on the line 20 and are connected to the ground line 22, and provide two reference voltage signals to the DAC core circuit 12 on lines 28 and 30. The DAC 10 also includes an input clock buffer 32 that receives a sinusoidal clock input signal on line 34, such as 26 GHz, and provides a square wave clock output signal on line 36, such as 13 GHz. The architecture and operation of the DAC 10 is known to those skilled in the art.

The DAC 10 also includes a digital clock tree distribution network 44 that receives the clock signal on the line 36 from the buffer 32 and outputs separate multiplexer select clock signals to converter cells in the DAC circuit 12 on lines 46, as will be discussed in detail below. According to the invention, the DAC circuit 12, the bias circuits 24 and 26 and the clock buffer 32 are all fabricated in InP to provide the desired higher voltage level and frequency bandwidth, and the clock tree distribution network 44 is fabricated in SiGe to provide higher component density to reduce signal line length, and thus clock skew. In one non-limiting embodiment, the DAC circuit 12, the bias circuits 24 and 26, the clock buffer 32 and the clock tree distribution network 44 are fabricated together using a compound semiconductor material on silicon (COSMOS) process, where the compound is InP and is integrated onto SiGe in a single chip. COSMOS fabrication processes are well known to those skilled in the art.

Figure 2:
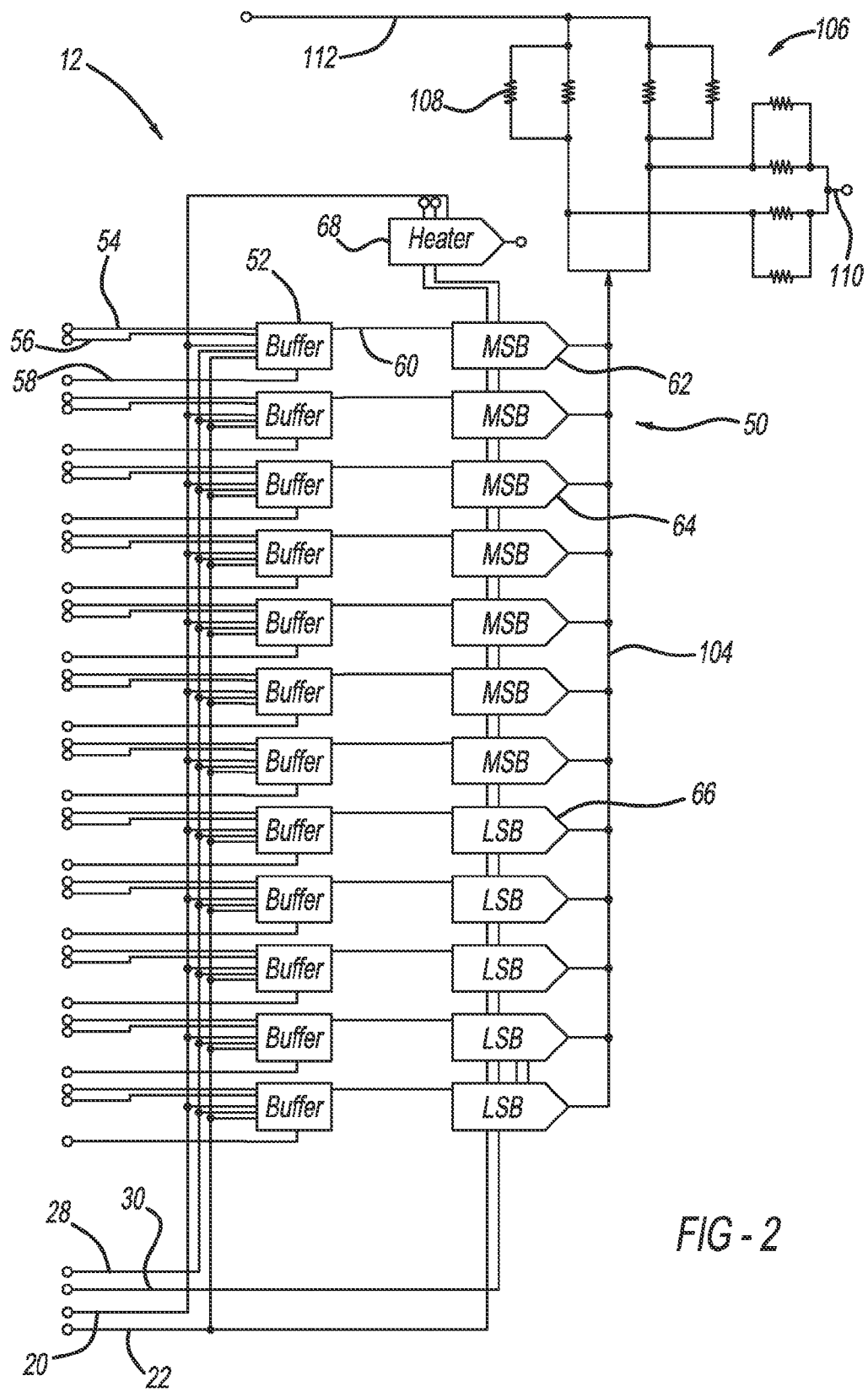
FIG. 2 is a schematic diagram of the DAC core circuit shown in FIG. 1.

FIG. 2 is a schematic diagram of the DAC core circuit 12 showing a plurality of converter cells 50, one for each of the input bits being converted. Each of the cells 50 includes a buffer circuit 52 that receives the A and B components of the digital input signals on lines 54 and 56, respectively, the voltage reference signals on the lines 28 and 30, the voltage drive signal VCC on the line 20 and the ground connection on the line 22. Additionally, each of the buffer circuits 52 receives a multiplexer select clock signal from the clock tree distribution network 44 on line 58, representative of the line 46. The buffered digital signal is provided on line 60.

Each of the cells 50 also includes a current switch 62, where some of switches 62 are most significant bit (MSB) current switches 64 that operate on a thermometer code digital conversion and some of the current switches 62 are least significant bit (LSB) current switches 66 that operate as digital current switches to provide a segmented DAC. The DAC core circuit 12 also includes a heater current switch 68 that does not receive any of the input bits, but provides a reference output current.

Figure 3:
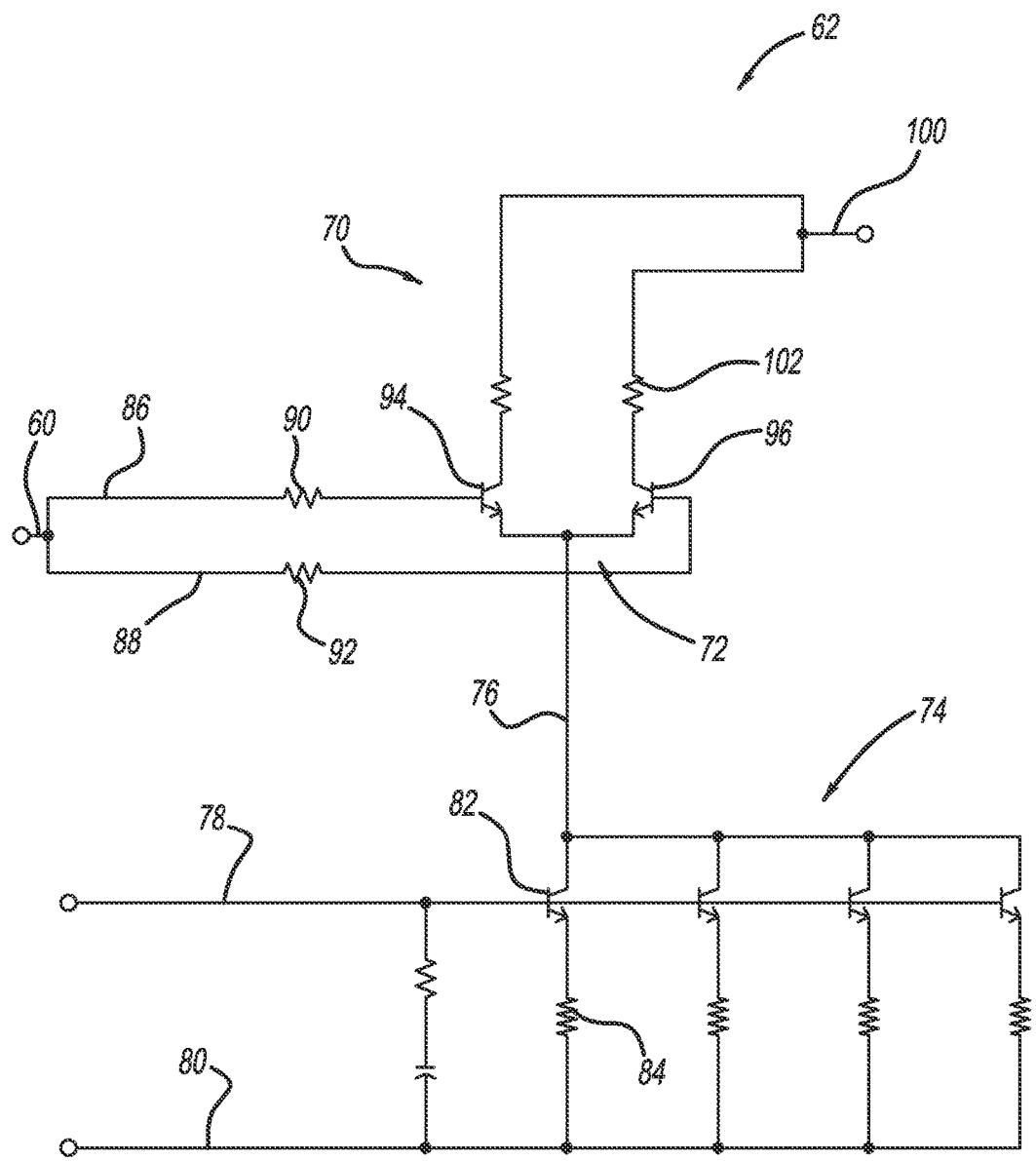
FIG. 3 is a schematic diagram of a current switching circuit in one of the DAC core circuit cells.

FIG. 3 is a schematic diagram of one of the current switches 62 separated from the circuit 12 that is representative of all of the MSB current switches 64 and the LSB current switches 66, where the current switches 62 employ a bipolar transistor digital pair design, well known to those skilled in the art. The current switch 62 includes a digital signal select circuit 70 including a bipolar transistor pair 72, and a current source circuit 74 that provides a controlled current to the bipolar transistor pair 72 on line 76. The current source circuit 74 receives one of the voltage reference signals on line 78 and a ground connection on line 80, and through a series of switching bipolar transistors 82 and resistors 84, provides a stable current flow on the line 76. The operation of the current circuit 74 is well understood by those skilled in the art. The digital signal from the buffer 52 on the line 60 is split into lines 86 and 88 and is applied to the base terminal of bipolar transistors 94 and 96, respectively, in the transistor pair 72 through resistors 90 and 92, respectively. The current on the line 76 is switched back and forth through the bipolar transistors 94 and 96 to be output on line 100 as a representative current signal for the input bit through resistors 102.

All of the current output signals from all of the current switches 62 in each cell 50 are combined on line 104 and sent to a loading circuit 106 that also receives the AVCC voltage on line 112. The loading circuit 106 includes a configuration of resistors 108 that converts the summed current output on the line 104 into a voltage output on line 110, representing the line 16, as the representative analog output signal of the combined digital input bits.

Figure 4:
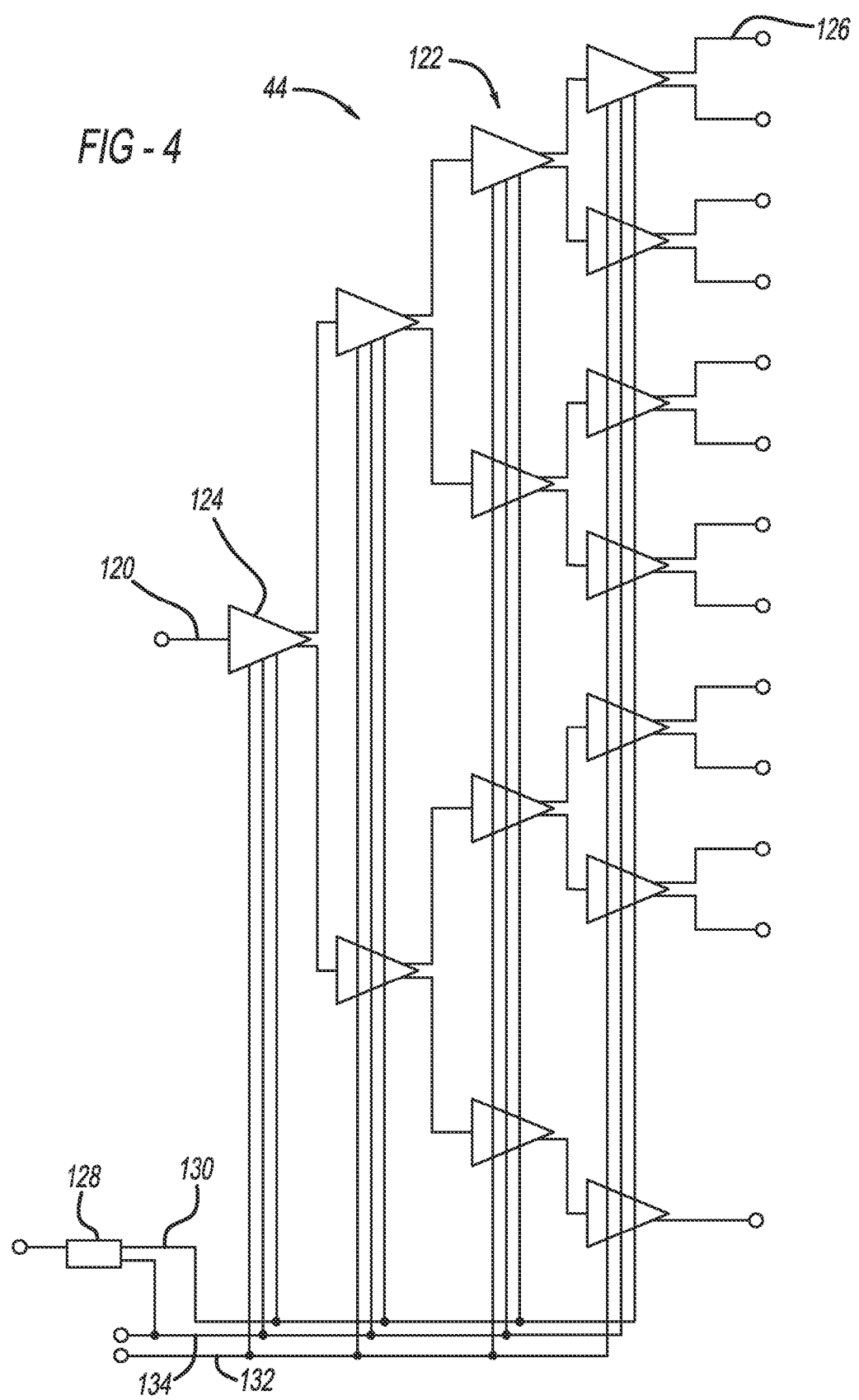
FIG. 4 is a schematic diagram of the clock tree distribution network shown in FIG. 1.

FIG. 4 is a schematic diagram of the clock tree distribution network 44 that receives the multiplexer select clock signal on line 120, representing the line 120. The clock tree distribution network 44 includes a number of stages 122, where each stage 122 includes a certain number of buffer splitters 124, and where the number of stages 122 will depend on the number of bits being converted, i.e., the number of the cells 50. Each of the buffer splitters 124 receives a voltage reference signal on line 130 provided by a reference voltage circuit 128, a power signal on line 132 and a ground connection on line 134. Each of the buffer splitters 124 after the first stage 122 receives a split clock signal, and separates that split signal into two identical clock signals, where the clock signals are switched out of the buffer splitter 124 at the same time, and where each stage 122 provides the split clock signals at the same time. As the split clock signals progress through the stages 122 they are all aligned in time with each other based on the delay of each of the buffer splitters 124 and the signal line length so that at the output of final stage 122, the clock tree distribution network 44 provides clock timing signals on lines 126 one for each of the cells 50 at the same time. Because the clock tree 44 is fabricated in SiGe, the ability to closely space all of the buffer splitters 124 and provide short signal lines allows the timing to be highly accurate and suitable for high frequencies.

The foregoing discussion disclosed and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A digital-to-analog converter (DAC) comprising:
   a DAC core circuit including a plurality of input lines each being responsive to a digital bit input signal and an output line outputting a converted analog signal of the digital bits;
   a clock circuit responsive to a clock input signal at one frequency and outputting a clock output signal at another frequency; and
   a clock tree distribution network responsive to the clock output signal from the clock circuit and splitting the clock output signal into a plurality of split clock signals that are applied to the DAC core circuit, wherein the DAC core circuit is fabricated in an indium phosphide (InP) semiconductor material and the clock tree distribution network is fabricated in a silicon germanium (SiGe) semiconductor material.

2. The DAC according to claim 1 wherein the DAC core circuit includes a plurality of DAC converter cells each including a buffer that receives one of the digital bit input signals and one of the plurality of split clock signals and a current switch that receives a buffered digital signal from the buffer and outputs a current output signal representative of the digital bit input signal.

3. The DAC according to claim 2 wherein all of the current output signals from all of the current switches in each of the cells are combined in a common current line, said DAC core circuit further including a loading circuit that receives the combined current signals from all of the cells and outputs a representative voltage signal as the converted analog signal.

4. The DAC according to claim 3 wherein each of the current switches in each of the cells includes a bipolar transistor pair and a current source circuit, where the bipolar transistor pair receives the buffered digital signal and a current signal from the current source circuit and provides the current output signal.

5. The DAC according to claim 1 wherein the clock tree distribution network includes a plurality of clock tree stages where each stage includes a plurality of buffers that receive a split clock signal and split the clock signal into two clock signals so that the split clock signals at the output of the clock tree are aligned in time.

6. The DAC according to claim 1 wherein the clock input signal is at 26 GHz and the clock output signal is at 13 GHz.

7. The DAC according to claim 1 wherein the DAC is fabricated using a compound semiconductor materials on silicon (COSMOS) process.

8. The DAC according to claim 1 wherein the DAC circuit receives twelve input bits.

9. The DAC according to claim 1 wherein the current switches include most significant bit current switches and least significant bit current switches.

10. The DAC according to claim 1 wherein the converted analog signal represents the digital bit input signals in both frequency and amplitude.

11. A digital-to-analog converter (DAC) comprising:
- a DAC core circuit including a plurality of input lines each being responsive to a digital bit input signal and an output line outputting a converted analog signal of the digital bits, where the converted analog signal represents the digital bits in both frequency and amplitude;
- a clock circuit responsive to a sinusoidal clock input signal at one frequency and outputting a clock output signal at another frequency; and
- a clock tree distribution network responsive to the clock output signal from the clock circuit and splitting the clock output signal into a plurality of split clock signals that are applied to the DAC core circuit, wherein the DAC core circuit is fabricated in an indium phosphide (InP) semiconductor material and the clock tree distribution network is fabricated in a silicon germanium (SiGe) semiconductor material using a compound semiconductor materials on silicon (COSMOS) process.

12. The DAC according to claim 11 wherein the DAC core circuit includes a plurality of DAC converter cells each including a buffer that receives one of the digital bit input signals and one of the plurality of split clock signals and a current switch that receives a buffered digital signal from the buffer and outputs a current output signal representative of the digital bit input signal.

13. The DAC according to claim 12 wherein all of the current output signals from all of the current switches in each of the cells are combined in a common current line, said DAC core circuit further including a loading circuit that receives the combined current signals from all of the cells and outputs a representative voltage signal as the converted analog signal.

14. The DAC according to claim 13 wherein each of the current switches in each of the cells includes a bipolar transistor pair and a current source circuit, where the bipolar transistor pair receives the buffered digital signal and a current signal from the current source circuit and provides the current output signal.

15. The DAC according to claim 11 wherein the clock tree distribution network includes a plurality of clock tree stages where each stage includes a plurality of buffers that receive a split clock signal and split the clock signal into two clock signals so that the split clock signals at the output of the clock tree are aligned in time.

16. The DAC according to claim 11 wherein the clock input signal is at 26 GHz and the clock output signal is at 13 GHz.

17. A digital-to-analog converter (DAC) comprising a DAC core circuit including a plurality of input lines each being responsive to a digital bit input signal and an output line outputting a converted analog signal of the digital bits and a clock tree distribution network providing a plurality of clock signals to the DAC core circuit, wherein the DAC core circuit is fabricated in an indium phosphide (InP) semiconductor material and the clock tree distribution network is fabricated in a silicon germanium (SiGe) semiconductor material.

18. The DAC according to claim 17 wherein the DAC is fabricated using a compound semiconductor materials on silicon (COSMOS) process.

19. The DAC according to claim 17 wherein the DAC receives a clock input signal at 26 GHz and provides a clock output signal at 13 GHz.

20. The DAC according to claim 17 wherein the clock tree distribution network includes a plurality of clock tree stages where each stage includes a plurality of buffers that receive a split clock signal and split the clock signal into two clock signals so that the split clock signals at the output of the clock tree are aligned in time.

* * * * *